United States Patent
Imanishi

(10) Patent No.: US 6,798,493 B2
(45) Date of Patent: Sep. 28, 2004

(54) PHOTOLITHOGRAPHY APPARATUS AND EXPOSURE METHOD

(75) Inventor: Shingo Imanishi, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/373,357

(22) Filed: Feb. 24, 2003

(65) Prior Publication Data

US 2003/0174301 A1 Sep. 18, 2003

(30) Foreign Application Priority Data

Feb. 28, 2002 (JP) ........................................ 2002-054836

(51) Int. Cl.⁷ ........................ G03B 27/52; G03B 27/32; G02B 7/02
(52) U.S. Cl. ............................ 355/55; 355/77; 359/823
(58) Field of Search .............................. 355/53, 55, 68, 355/77; 250/492.1, 492.2; 359/823; 369/53.27, 53.28

(56) References Cited

U.S. PATENT DOCUMENTS

| | | | |
|---|---|---|---|
| 5,121,256 A | * | 6/1992 | Corle et al. ................ 359/664 |
| 6,181,478 B1 | * | 1/2001 | Mandella ..................... 359/642 |
| 6,301,055 B1 | * | 10/2001 | Legrand et al. ............. 359/642 |
| 6,307,689 B1 | * | 10/2001 | Ichimura et al. ............ 359/823 |

FOREIGN PATENT DOCUMENTS

JP WO00/23991 * 4/2000 ............ G11B/7/09

* cited by examiner

Primary Examiner—Alan Mathews
(74) Attorney, Agent, or Firm—Robert J. Depke; Holland & Knight LLP

(57) ABSTRACT

A photolithography apparatus includes a laser beam source, a focusing lens, a detecting unit, and a control unit. The laser beam source emits a laser beam. The focusing lens is disposed in the near field of an exposure surface of an exposure substrate for receiving the laser beam emitted from the laser beam source. The detecting unit detects one linearly polarized component of the laser beam reflected from the distal end surface of the focusing lens. The control unit controls the distance between the distal end surface of the focusing lens and the exposure surface based on a detection signal supplied from the detecting unit.

20 Claims, 1 Drawing Sheet

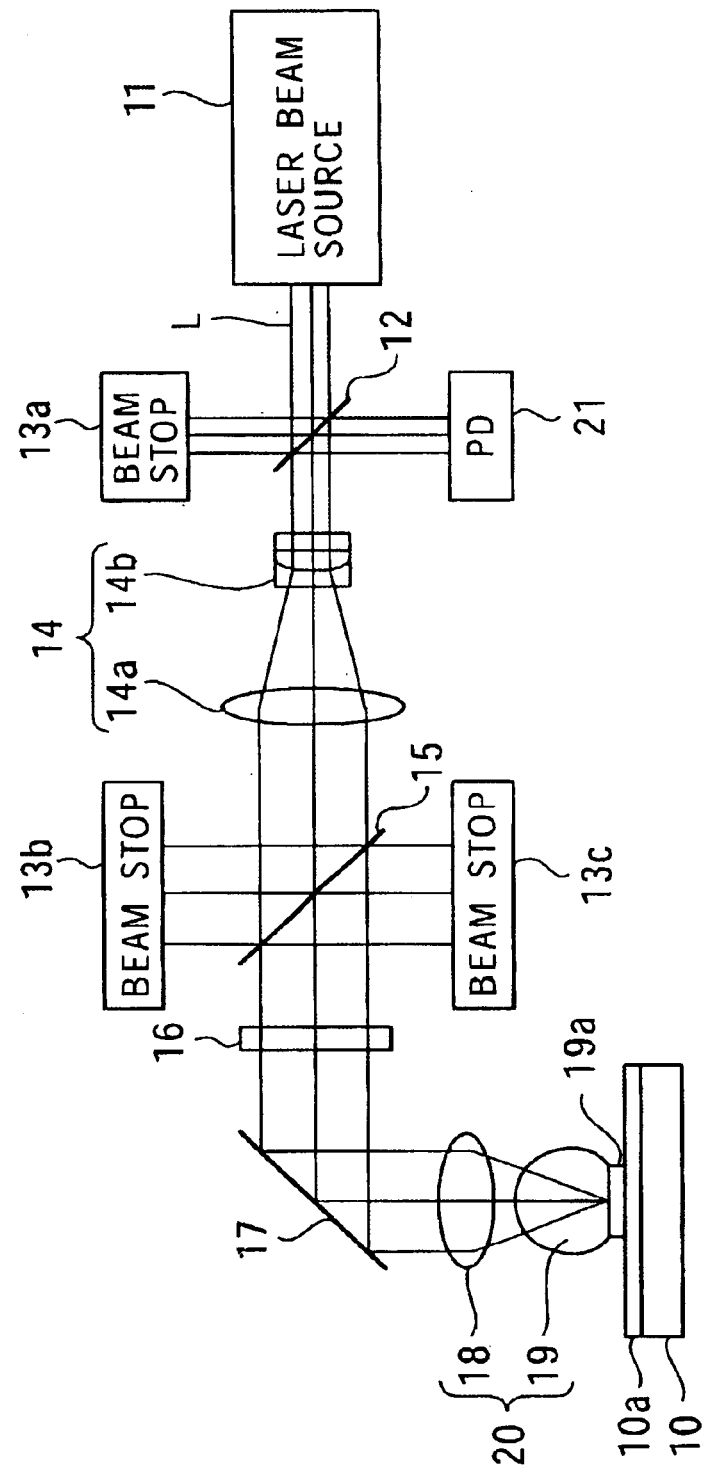

PHOTOLITHOGRAPHY APPARATUS AND EXPOSURE METHOD

This application claims priority to Japanese Patent Application Number JP2002-054836 filed Feb. 28, 2002, which is incorporated herein by reference.

BACKGROUND OF THE INVENTION

1. Field of the Invention

The present invention relates to a photolithography apparatus and a method of controlling a focusing lens, and, more specifically, the present invention relates to a photolithography apparatus using a solid immersion lens and a method of controlling a focusing lens.

2. Description of the Related Art

In recent years, reduction in spot diameter has been required corresponding to the demands for increased memory density of optical disks. In order to do so, a solid immersion lens (SIL), which is shaped like a spherical lens having a part removed with a high refractive index, is disposed between an objective lens and an exposure substrate to obtain larger numerical apertures (for example, a numerical aperture of two or more) than the numerical apertures of the objective lens. The SIL is disposed in such a manner that the spherical surface faces toward the objective lens, and the opposite side from the spherical surface, that is, the flat surface of the lens, faces toward the exposure substrate. The large number of apertures may be achieved also by using a solid immersion mirror (SIM) instead of the SIL.

In order to perform exposure by using the SIL, it is necessary to focus an exposure laser beam passing through the objective lens onto the SIL, and to reduce the distance between the distal end surface, that is, the lowermost end surface, of the SIL (the surface of the SIL facing toward the exposure substrate) and the irradiated surface of the exposure substrate to an area in which evanescent light is generated, in other words, to the so-called near field. In this case, it is necessary to perform gap control to keep the distance between the distal end surface of the SIL and the irradiated surface of the exposure substrate constant.

In order to perform gap control, a method of detecting the distance between the distal end surface of the SIL and the irradiated surface of the exposure substrate, that is to say, the length of the gap, is required. As one of such methods, there is a total reflection detecting method. In this total reflection detecting method, a high NA (numerical apertures) beam (NA≧1.0) incident on the focusing lens, including the SIL and the objective lens, is totally reflected from the distal end surface of the SIL when the distal end surface of the SIL is substantially distant from the irradiated surface of the exposure substrate, while the intensity of the return beam is reduced when the distal end surface of the SIL is in the near field.

In other words, gap control is performed in such a manner that the gap length, that is, the distance between the distal end surface of the SIL and the irradiated surface of the exposure substrate, is maintained constant by controlling a gap with a servomechanism when the intensity of the return beam from the distal end surface of the SIL is reduced to a predetermined value.

Gap control utilizing the total reflection detecting method has been performed by disposing a light shielding circular mask in the optical path for blocking returned components of the beam incident on an area of the focusing lens where the NA is less than one and reflected from the distal end surface of the SIL, and detecting only the light intensity of returned components of the beam incident on an area of the focusing lens where the NA is greater than one, in other words, the return beam incident on the distal end surface of the focusing lens at angles not smaller than the critical angle.

Such a method is satisfactory when the gap is controlled by the servomechanism of the focusing lens and the distance between the distal end surface of the focusing lens and the irradiated surface of the exposure substrate is maintained constant. However, when the servomechanism for controlling the gap is not working, a return beam reflected under the principle of Fresnel reflection, excluding returned components of the beam incident on the region of the focusing lens where the NA is greater than one, cannot be blocked sufficiently only by the light shielding circular mask. Consequently, the components of the beam that could not be blocked are superimposed on the detected beam, which results in detection of errors. In addition, leakage of the beam from the edge of the light shielding circular mask may also result in errors in the detected beam.

SUMMARY OF THE INVENTION

Accordingly, it is an object of the present invention to provide a photolithography apparatus which resolves the above-mentioned problems.

It is another object of the invention to provide a method of controlling a focusing lens which resolves the above-mentioned problems.

According to the invention, there is provided a photolithography apparatus including a laser beam source, a focusing lens, a detecting unit, and a control unit. The laser beam source emits a laser beam. The focusing lens is disposed in the near field of the exposure surface of an exposure substrate and receives the laser beam emitted from the laser beam source. The detecting unit detects one linearly polarized component of the laser beam reflected from the distal end surface of the focusing lens. The control unit controls the distance between the distal end surface of the focusing lens and the exposure surface based on detection signals detected by the detecting unit.

According to the invention, there is provided a method of controlling the focusing lens. This method controls the distance between the distal end surface of the focusing lens and the exposure surface by the steps of detecting one linearly polarized component of the laser beam reflected from the distal end surface of the focusing lens, which is disposed in the near field of the exposure surface of the exposure substrate, and moving the focusing lens in the direction of the optical axis based on the signal obtained by detection.

BRIEF DESCRIPTION OF THE DRAWINGS

FIG. 1 is a schematic explanatory drawing illustrating the general structure of a photolithography apparatus according to an embodiment of the invention.

DESCRIPTION OF THE PREFERRED EMBODIMENT

Referring now to the drawing, an embodiment of the invention will be described in detail.

FIG. 1 shows the general structure of the photolithography apparatus according to the embodiment of the invention. The photolithography apparatus performs gap control in which the distance, that is, a gap length, between a distal end surface 19a, that is, the lowermost end surface, of an SIL 19 and the exposure surface of an exposure substrate 10 is maintained constant to perform exposures of a resist 10a, which is applied to the exposure substrate 10, by an exposure laser beam L.

The photolithography apparatus includes a laser beam source such as a gas laser, a normal beam splitter (NBS) 12, beam stops 13a, 13b, and 13c, a beam expander (BE) 14 including a convex lens 14a and a concave lens 14b, a polarized beam splitter (PBS) 15 for allowing the P-polarized component to pass and reflecting the S-polarized component, a quarter wave plate (QWP) 16, a mirror 17, a focusing lens 20 including an objective lens 18 and the SIL 19, and a photo detector (PD) 21. The beam stops 13a, 13b, and 13c are formed, for example, of black plates or the like, and may be made of any material as long as it can absorb the laser beam. It is also possible to eliminate the beam stops 13a, 13b, and 13c and to allow the beam to scatter at a sufficient distance. Though it is not shown, the photolithography apparatus includes an actuator for moving the focusing lens 20 in parallel with the optical axis, and gap control is performed by moving the focusing lens 20 in the direction of the optical axis by the actuator.

The gap control for maintaining the distance (gap length) between the distal end surface 19a, that is, the lowermost end surface, of the SIL 19 and the exposure surface of the exposure substrate 10 constant in such a photolithography apparatus will be described.

An exposure laser beam L is emitted from the laser beam source 11. The exposure laser beam L is partly reflected from the NBS 12, and the reflected beam is absorbed by the beam stop 13a. Gap control accuracy is improved by allowing the beam stop 13a to absorb the part of the exposure laser beam L reflected from the NBS 12 in this manner to prevent it from returning to the NBS 12 again.

On the other hand, the diameter of exposure laser beam L passing through the NBS 12 is expanded by a beam expander 14 to a value sufficiently larger than an entrance pupil of the objective lens 18. Since the exposure laser beam L whose beam diameter is expanded by the beam expander 14 is a P-polarized beam with respect to the reflecting surface of the PBS 15, it passes through the PBS 15 at almost 100%. When the extinction ratio of the PBS 15 is low, a small portion of the exposure laser beam L may be reflected from the PBS 15, but any beam reflected from the PBS 15 is absorbed by the beam stop 13b. In this manner, by allowing the beam stop 13b to absorb the reflected beam of the exposure laser beam L from the PBS 15 to prevent the reflected beam from returning to the PBS 15 again, the gap control accuracy is improved.

The exposure laser beam L passing through the PBS 15 is converted from a linearly polarized beam to a circularly polarized beam by being passed through the quarter wave plate 16, which is disposed with its crystal axis inclined by 45° with respect to the direction of the incoming polarized beam.

After being converted into the circularly polarized beam by the quarter wave plate 16, the exposure laser beam L is reflected by the mirror 17 and enters the objective lens 18 after the optical path thereof is deflected by 90°. Since the SIL 19 is disposed in such a manner that the exposure laser beam L is focused on the distal end surface 19a of the SIL 19 by the objective lens 18, the exposure laser beam L reflected at the distal end surface 19a of the SIL 19 returns to the mirror 17 as a return beam.

The exposure laser beam L incident on the distal end surface 19a of the SIL 19 at an angle not more than the critical angle is reflected at the distal end surface 19a, passes again through the SIL 19 and the objective lens 18 as the return beam, and is in turn converted into a linearly polarized beam by the quarter wave plate 16. After being converted into the linearly polarized beam by the quarter wave plate 16, the return beam is reflected by the PBS 15 because it is incident on the PBS 15 as an S-polarized beam. The return beam reflected from the PBS 15 is absorbed by the beam stop 13c. In this manner, by allowing the beam stop 13c to absorb the return beam reflected from the PBS 15, reflected components of the return beam may be prevented from returning again to the PBS 15, and thus gap control with a higher degree of accuracy is achieved.

On the other hand, the exposure laser beam L incident on the distal end surface 19a of the SIL 19 at an angle not less than the critical angle, or the high-NA component of the exposure laser beam L incident on the area of the focusing lens 23 where the NA is greater then one when the gap material is air, is reflected from the distal end surface 19a to form an elliptically polarized beam, which is not converted to a linearly polarized beam even after having passed through the SIL and the objective lens 18 as the return beam, being reflected form the mirror 17, and passing through the quarter wave plate 16. Therefore, the S-polarized component of the return beam is reflected from the PBS 15, and is absorbed by the beam stop 13c, while the P-polarized component of the return beam passes through the PBS 15. The P-polarized component of the return beam, which is in the same P-polarized state as the exposure laser beam L emitted from the laser beam source 1, is in turn reduced in beam diameter by the beam expander 14, and consequently, the return beam partly passes through the NBS 12, and is partly reflected by the NBS 12 to enter the PD 21, where the intensity of the return beam is detected by the PD 21.

The light intensity of the return beam detected by the PD 21 exhibits a certain constant value since the beam incident on the distal end surface 19a of the SIL 19 at an angle greater than the critical angle is totally reflected from the distal end surface 19a in the case where the distal end surface 19a of the SIL 19 is sufficiently distant from the exposure surface of the exposure substrate 10 and the distal end surface 19a of the SIL 19 is away from the near field region. However, when the distance between the distal end surface 19a of the SIL 19 and the exposure surface of the exposure substrate 10 reaches the near field region, for example, within a region less than the wavelength of the beam, the components of the exposure laser beam L, which was previously totally reflected from the distal end surface 19a of the SIL 19, pass therethrough toward the exposure substrate 10, which results in reduction of the light intensity of the return beam detected by the PD 21. In addition, when the gap between the distal end surface 19a of the SIL 19 and the exposure surface of the exposure substrate 10 becomes zero, almost all of the components of the exposure laser beam L that was previously totally reflected from the distal end surface 19a of the SIL 19 leak toward the exposure substrate 10, that is, the exposure laser beam L passes through the SIL 19, and thus the light intensity of the return beam detected by the PD 21 becomes substantially zero.

Therefore, a reference level is set to a predetermined value, for example, 60% of the light intensity of the P-polarized component detected by the PD 21 when the distance between the distal end surface 19a of the SIL 19 and the exposure surface of the exposure substrate 10 is sufficiently large and is away from the near field region. By moving the objective lens 18 and the SIL 19 constituting the focusing lens 20 as a single unit in the direction of the optical axis by an actuator constructed of a piezoelectric element so that the light intensity of the return beam detected by the PD 21 is equal to the reference level, the gap between the distal end surface 19a of the SIL 19 and the exposure surface of the exposure substrate 10 can be maintained constant. The actuator constitutes a gap control device for performing gap control of the focusing lens 20.

In other words, in the gap control device, a gap control voltage is generated using a signal representing the light intensity of the P-polarized component of the return beam detected by the PD 21 as a controlled amount, and the gap control voltage is supplied, for example, to the piezoelectric element, serving as the actuator, to expand and contract the piezoelectric element, so that the distance, that is, the gap length, between the distal end surface 19a of the SIL 19 constituting the focusing lens 20 having the piezoelectric element attached thereto and the exposure surface of the exposure substrate 10 is controlled.

In such manner, while performing gap control, the exposure laser beam L is supplied to the objective lens 18 through the NBS 12, the beam expander 14, the PBS 15, the quarter wave length 16, and the mirror 17, and is focused on the distal end surface 19a of the SIL 19 by the objective lens 18. As a consequence, the exposure laser beam L leaks out from the distal end surface 19a, and thus exposure of the resist 10a on the exposure substrate 10 may be performed by evanescent light.

Sometimes, the exposure laser beam L is focused at a position shifted from the distal end surface 19a of the SIL 19, which is designed focal point, due to the generation of spherical aberration as a result of adjustment errors of the distance between the objective lens 18 and the SIL 19 or the mechanical tolerances of the objective lens 18 itself.

When the actual focal point is at the position nearer than the distal end surface 19a of the SIL 19, that is, inside the SIL 19, although the objective lens 18 is designed to receive a parallel beam and converge the same onto the distal end surface 19a of the SIL 19, the focal point may be shifted to a farther position by reducing the distance between, for example, the concave lens 14b and the convex lens 14a constituting the beam expander 14 and using a diverging laser beam so that the laser beam focuses on the distal end surface 19a of the SIL 19. In contrast, when the focal point of the objective lens 18 is on the farther side of the distal end surface 19a of the SIL 19, the beam may be focused on the distal end surface 19a of the SIL 19 by increasing the distance between the concave lens 14b and the convex lens 14a constituting the beam expander 14. In this manner, the position of the focal point of the objective lens 18 may be adjusted, or focus bias adjustment may be achieved by adjusting the distance between the concave lens 14b and the convex lens 14a constituting the beam expander 14.

In order to confirm whether or not the exposure laser beam L is focused on the distal end surface 19a of the SIL 19, the fact that the exposure laser beam L focused on and reflected from the distal end surface 19a of the SIL 19 returns along the same optical path as that of the laser beam passing when incident on the SIL 19 is utilized. A part of the exposure laser beam L emitted form the laser beam source 11 and a part of the return beam reflected by the SIL 19 are sampled by the NBS 12 disposed at the laser beam source 11 side of the beam expander 14 where the laser beam is a parallel beam, and the diameters of the respective beams are detected. The detected beam diameters are equal when the exposure laser beam L is focused onto and reflected from the distal end surface 19a of the SIL 19, while the beam diameters are different when the focal point of the exposure laser beam L is shifted from the distal end surface 19a. It is also possible to dispose another NBS or the like at the laser beam source 11 side of the beam expander 14 separately from the NBS 12 to sample part of the exposure laser beam L emitted from the laser beam source 11 and part of the return beam reflected from the SIL 19 to detect the respective beam diameters. For example, when the beam expander 14 is disposed at the laser beam source 11 side of the NBS 12, it is also possible to disposed another NBS or the like between the beam expander 14 and the laser beam source 11 separately from the NBS 12 so that part of the exposure laser beam L and part of the return beam reflected from the SIL 19 are detected.

For example, when the focal point of the exposure laser beam L is shifted to the near side of the distal end surface 19a of the SIL 19, the beam diameter of the return beam is reduced. In contrast, when the focal point of the exposure laser beam L is shifted to the far side of distal end surface 19a of the SIL 19, the beam diameter of the return beam increases. Therefore, it is possible to adjust the exposure laser beam L to make it focus onto the distal end surface 19a of the SIL 19 by adjusting the distance between the concave lens 14b and the convex lens 14a of the beam expander 14 to equalize the beam diameters of the exposure laser beam L and the return beam.

As described thus far, since the present embodiment is adapted in such a manner that only the P-polarized component of the return beam of the exposure laser beam L incident on the distal end surface 19a of the SIL 19 at an angle not less than the critical angle is detected, it is not necessary to provide a circular light shielding mask as in the related art, and stable gap adjustment is achieved with a high degree of accuracy. In addition, the possibility of occurrence of breakdown of the servomechanism due to mechanical disturbance is dramatically reduced. Furthermore, the signal noise Ratio of an optical disk manufactured by the use of the exposure substrate exposed by the photolithography apparatus according to the present embodiment is dramatically improved.

Since the beam expander 14 is adapted in such a manner that the focus bias may be adjusted by adjusting the distance, for example, between the concave lens 14b and the convex lens 14a of the beam expander 14, a wide margin of displacement of the distance between the objective lens 18 and the SIL 19 or of the spherical aberration of the objective lens 18 itself can be compensated.

Although the invention has been described in terms of the preferred embodiment, the invention is not limited to the above-mentioned embodiment, and may be modified in various ways.

For example, although the beam expander is disposed between the NBS and the PBS in the above-mentioned embodiment, it is not limited thereto, and may be disposed between the NBS and the objective lens. When the beam expander is disposed on the laser beam source side of the NBS as described above, another NBS or the like must simply be disposed on the laser beam source side of the beam expander for adjusting the focus bias.

Although the beam expander has a role of increasing the beam diameter incident on the objective lens as well as a role of adjusting the focus bias, when the beam diameter of the beam emitted from the laser beam source is sufficiently large, it is not necessary to expand it again, and, on the contrary, it is also possible to dispose lenses to reduce the beam diameter. However, it is at least necessary to ensure that the beam incident on the objective lens has a diameter sufficiently larger than the entrance pupil of the objective lens.

In addition, although an example in which exposure of an exposure substrate is performed has been described in the above-mentioned embodiment, the invention may be applied to gap adjustment or focus bias adjustment using the SIL or the like generally in the field of optical recording media.

Although an example in which an SIL is used as a focusing lens has been described in the above-mentioned embodiment, the invention may also be applied to an SIM (Solid Immersion Mirror) or other optical elements that need to be close to the near field.

As described thus far, according to the photolithography apparatus and the method of exposure of the present invention, since only the light intensity of a component of a return beam of the laser beam for exposure incident on the distal end surface of the focusing lens at an angle greater than the critical angle is detected to control the gap during exposure by utilizing evanescent light, stable gap control with a high degree of accuracy is achieved.

What is claimed is:

1. A photolithography apparatus comprising:
   a laser beam source for emitting a laser beam;
   a focusing lens disposed near a surface of an exposure substrate, said focusing lens receiving the laser beam emitted from the laser beam source;
   a detecting unit for detecting a linearly polarized component of the laser beam, which is reflected at a distal end surface of the focusing lens; and
   a control unit for controlling a distance between the distal end surface of the focusing lens and the exposure surface based on the signal detected by the detecting unit.

2. A photolithography apparatus according to claim 1, wherein, from the laser beam reflected at the distal end surface of the focusing lens, the detecting unit detects the linearly polarized component that has a same polarization as the laser beam emitted from the laser beam source.

3. A photolithography apparatus according to claim 2, wherein the focusing lens comprises an objective lens, and a solid immersion lens which is disposed between the objective lens and the exposure surface.

4. A photolithography apparatus according to claim 3, further comprising a polarized beam splitter disposed in the optical path between the laser beam source and the focusing lens, and a quarter wave plate disposed between the polarized beam splitter and the focusing lens.

5. A photolithography apparatus according to claim 4, further comprising a first beam absorbing member for absorbing a beam reflected at the polarized beam splitter from the laser beam emitted from the laser beam source.

6. A photolithography apparatus according to claim 5, further comprising a second beam absorbing member for absorbing a beam reflected at the polarized beam splitter from the laser beam reflected from the distal end surface.

7. A photolithography apparatus according to claim 4, further comprising a beam splitter disposed in the optical path between the laser beam source and the polarized beam splitter.

8. A photolithography apparatus according to claim 7, wherein the beam splitter is a normal beam splitter.

9. A photolithography apparatus according to claim 7, further comprising a beam absorbing member for absorbing a beam reflected at the beam splitter from the laser beam emitted from the laser beam source.

10. A photolithography apparatus according to claim 7, wherein, from the laser beam reflected at the distal end surface, the detecting unit detects the beam passing through the polarized beam splitter and reflected from the beam splitter.

11. A photolithography apparatus according to claim 7, further comprising a beam expander disposed on the optical path between the beam splitter and the polarized beam splitter.

12. A method of controlling a focusing lens comprising the steps of:
    detecting a linearly polarized component of a laser beam reflected at the distal end surface of the focusing lens, which is disposed near an exposure surface; and
    moving the focusing lens in the direction of an optical axis based on the detected signal.

13. A method of controlling a focusing lens according to claim 12, further comprising a step of detecting from the laser beam reflected at the distal end surface of the focusing lens the linearly polarized component that has a same polarization as the laser beam emitted from the laser beam source.

14. A method of controlling a focusing lens according to claim 13, wherein the focusing lens comprises an objective lens, and a solid immersion lens which is disposed between the objective lens and the exposure surface.

15. A method of controlling a focusing lens according to claim 14, further comprising the steps of:
    providing a quarter wave plate; and
    a polarized beam splitter for allowing the linearly polarized component which has a same polarization as the laser beam emitted from the laser beam source to pass therethrough and a second linearly polarized component orthogonal to the first linearly polarized component to be reflected therefrom; and
    converting the beam incident on the distal end surface of the focusing lens at angles not more than the critical angle into the orthogonal linearly polarized component by means of the quarter wave plate.

16. A method of controlling a focusing lens according to claim 15, further comprising a step of absorbing the beam reflected by the polarized beam splitter by a beam absorbing member.

17. A method of controlling a focusing lens according to claim 16, further comprising a step of providing another beam absorbing member for absorbing the beam reflected from the polarized beam splitter out of the laser beam emitted from the laser beam source.

18. A method of controlling a focusing lens according to claim 14, further comprising a step of detecting a beam that is reflected from the distal end surface of the focusing lens and which passes through the polarized beam splitter.

19. A method of controlling a focusing lens according to claim 14, further comprising providing a beam expander disposed between the laser beam source and the objective lens; and
    which thereby allows adjusting of a focal point of the objective lens.

20. A method of controlling a focusing lens according to claim 19, wherein the beam expander includes a convex lens and a concave lens, and the focal point of the objective lens is adjusted by adjusting the distance between the convex lens and the concave lens.

* * * * *